US010813244B2

(12) United States Patent
Liu et al.

(10) Patent No.: US 10,813,244 B2
(45) Date of Patent: Oct. 20, 2020

(54) ELECTRONIC DEVICE INCLUDING A WATERPROOF CASE AND FLOW GUIDE ASSEMBLY INCLUDING A FAN AND AN AIRFLOW GUIDE PLATE

(71) Applicant: Siemens Ltd., China, Beijing (CN)

(72) Inventors: Hai Liu, Kunshan (CN); Xue Feng Zhu, Suzhou (CN); De Zhong Han, Jiangsu (CN); Hai Bo Sheng, Suzhou (CN); Xi Tao, Suzhou (CN)

(73) Assignee: SIEMENS LTD., CHINA, Beijing (CN)

( * ) Notice: Subject to any disclaimer, the term of this patent is extended or adjusted under 35 U.S.C. 154(b) by 0 days.

(21) Appl. No.: 16/135,070

(22) Filed: Sep. 19, 2018

(65) Prior Publication Data

US 2019/0104629 A1    Apr. 4, 2019

(30) Foreign Application Priority Data

Sep. 29, 2017 (CN) .......................... 201721275539.3

(51) Int. Cl.
*H05K 7/20* (2006.01)
*H05K 5/06* (2006.01)
(Continued)

(52) U.S. Cl.
CPC ....... *H05K 7/20145* (2013.01); *H05K 5/0213* (2013.01); *H05K 5/06* (2013.01); *H05K 7/20172* (2013.01); *G06F 1/20* (2013.01)

(58) Field of Classification Search
CPC .......... H05K 7/20172; H05K 7/20145; H05K 5/0213; H05K 5/06; G06F 1/20
See application file for complete search history.

(56) References Cited

U.S. PATENT DOCUMENTS 5,226,540 A * 7/1993 Bradbury .............. G06F 1/1628
206/320
7,554,805 B2 * 6/2009 Liu .......................... G06F 1/20
165/104.33
(Continued)

FOREIGN PATENT DOCUMENTS

| EP | 2822370 A1 | 1/2015 |
| JP | H0710984 U | 2/1995 |
| JP | 2012044038 A | 3/2012 |

OTHER PUBLICATIONS

Extended European Search Report dated Feb. 21, 2019.

*Primary Examiner* — Zachary Pape
(74) *Attorney, Agent, or Firm* — Harness, Dickey & Pierce, P.L.C.

(57) ABSTRACT

An electronic device includes a waterproof case, including a closed space, and a flow guide assembly, an electronic module and a cover, provided in the closed space. The cover includes a cover top plate and a cover side plate which, together with a case bottom plate and a case side plate, form an accommodation space for accommodating the flow guide assembly and the electronic module. Further, the cover includes a first vent hole and a second vent hole. The flow guide assembly is configured to guide air, entering the accommodation space from the first vent hole, to flow through the electronic module and to be discharged from the second vent hole. The flow guide assembly is further configured to guide air, entering the cavity from the first vent hole, to flow through the electronic module and to be discharged from the second vent hole.

15 Claims, 9 Drawing Sheets

(51) Int. Cl.
  *H05K 5/02*    (2006.01)
  *G06F 1/20*    (2006.01)

(56) References Cited

U.S. PATENT DOCUMENTS

| | | | |
|---|---|---|---|
| 7,628,271 B1 * | 12/2009 | Marton | G06F 1/1628 206/305 |
| 2008/0113676 A1 * | 5/2008 | Hutton | H05K 5/06 455/461 |
| 2015/0185772 A1 * | 7/2015 | Arnouse | H05K 7/20736 361/679.26 |
| 2016/0135316 A1 | 5/2016 | Kristiansen et al. | |
| 2019/0064876 A1 * | 2/2019 | Liu | A45C 5/14 |

* cited by examiner

ELECTRONIC DEVICE INCLUDING A WATERPROOF CASE AND FLOW GUIDE ASSEMBLY INCLUDING A FAN AND AN AIRFLOW GUIDE PLATE

PRIORITY STATEMENT

The present application hereby claims priority under 35 U.S.C. § 119 to Chinese patent application number CN201721275539.3 filed Sep. 29, 2017, the entire contents of which are hereby incorporated herein by reference.

FIELD

At least one embodiment of the present invention generally relates to the technical field of electronic technology, in particular to an electronic device.

BACKGROUND

At present, many electronic devices need to have a waterproof function, and during the operation of the electronic devices with the waterproof function (for example, big data processing devices), electronics thereof will release heat, resulting in an increase in the internal temperature of the electronic devices, which not only affects the operation of the electronic devices but also shortens the service life of the electronic devices. Therefore, the heat generated by the electronics needs to be removed from the electronic devices. However, since the electronic device needs to be waterproof, it is generally not allowed to directly provide a heat dissipation hole on a top cover of the device. Therefore, the current electronic devices have difficulty with heat dissipation.

SUMMARY

In order to solve or improve upon the above and/or other technical problems, embodiments of the present invention are directed to an electronic device, which is waterproof and facilitates heat dissipation.

At least one embodiment of the present invention provides an electronic device, comprising a waterproof case, a flow guide assembly, an electronic module and a cover, in which: the waterproof case comprises a closed space formed by a case top plate, a case bottom plate and a case side plate connected between the case top plate and the case bottom plate, and the flow guide assembly, the electronic module and the cover are provided in the closed space; the cover comprises a cover top plate and a cover side plate, and the cover top plate and the cover side plate, together with the case bottom plate and the case side plate, form an accommodation space for accommodating the flow guide assembly and the electronic module; and the cover is formed with a first vent hole and a second vent hole, and the flow guide assembly is configured to guide air such that same enters the accommodation space from the first vent hole, flows through the electronic module, and is discharged from the second vent hole.

At least one embodiment of the present invention provides an electronic device, comprising: a waterproof case, and a flow guide assembly, an electronic module and a cover provided inside the waterproof case, in which:

the waterproof case is a closed space formed by a top plate, a bottom plate, and a side plate; the cover comprises a top plate and a side plate provided on the top plate; the top and side plates of the cover and the bottom and side plates of the waterproof case form a cavity for accommodating the flow guide assembly and the electronic module; and the cover is provided with a first vent hole and a second vent hole, and the flow guide assembly is capable of guiding air such that same enters the cavity from the first vent hole, flows through the electronic module, and is discharged from the second vent hole.

BRIEF DESCRIPTION OF THE DRAWINGS

To make the above and other features and advantages of the present invention more apparent for those of ordinary skill in the art, preferred embodiments of the present invention are described in detail below with reference to the accompanying drawings, in which.

| Reference Signs | Meanings |
| --- | --- |
| 11 | First case |
| 12 | Second case |
| 13 | Data processing module |
| 131 | Processing unit |
| 14 | Display module |
| 15 | Interface module |
| 151 | Data interface on the interface module |
| 16 | Cover |
| 161 | First vent hole |
| 162 | Second vent hole |
| 163 | Top plate of the cover |
| 164 | Side plate of the cover |
| 165 | Hollowed region on the cover |
| 17 | Airflow guide plate |
| 18 | Fan |
| 19 | First sub-cavity |
| 20 | Second sub-cavity |
| 21 | Fan bracket |
| 211 | Opening of the fan bracket |

DETAILED DESCRIPTION OF EXAMPLE EMBODIMENTS

In the following, embodiments of the invention are described in detail with reference to the accompanying drawings. It is to be understood that the following description of the embodiments is given only for the purpose of illustration and is not to be taken in a limiting sense. It should be noted that the drawings are to be regarded as being schematic representations only, and elements in the drawings are not necessarily to scale with each other. Rather, the representation of the various elements is chosen such that their function and general purpose become apparent to a person skilled in the art.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Various example embodiments will now be described more fully with reference to the accompanying drawings in which only some example embodiments are shown. Specific structural and functional details disclosed herein are merely representative for purposes of describing example embodiments. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated. The present invention, however, may be embodied in many alternate forms and should not be construed as limited to only the example embodiments set forth herein.

It will be understood that, although the terms first, second, etc. may be used herein to describe various elements, components, regions, layers, and/or sections, these elements, components, regions, layers, and/or sections, should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items. The phrase "at least one of" has the same meaning as "and/or".

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Also, the term "exemplary" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Before discussing example embodiments in more detail, it is noted that some example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Specific structural and functional details disclosed herein are merely representative for purposes of describing example embodiments of the present invention. This invention may, however, be embodied in many alternate forms and should not be construed as limited to only the embodiments set forth herein.

At least one embodiment of the present invention provides an electronic device, comprising a waterproof case, a flow guide assembly, an electronic module and a cover, in which:

the waterproof case comprises a closed space formed by a case top plate, a case bottom plate and a case side plate connected between the case top plate and the case bottom plate, and the flow guide assembly, the electronic module and the cover are provided in the closed space; the cover comprises a cover top plate and a cover side plate, and the cover top plate and the cover side plate, together with the case bottom plate and the case side plate, form an accommodation space for accommodating the flow guide assembly and the electronic module; and the cover is formed with a first vent hole and a second vent hole, and the flow guide assembly is configured to guide air such that same enters the accommodation space from the first vent hole, flows through the electronic module, and is discharged from the second vent hole.

At least one embodiment of the present invention provides an electronic device, comprising: a waterproof case, and a flow guide assembly, an electronic module and a cover provided inside the waterproof case, in which:

the waterproof case is a closed space formed by a top plate, a bottom plate, and a side plate; the cover comprises a top plate and a side plate provided on the top plate; the top and side plates of the cover and the bottom and side plates of the waterproof case form a cavity for accommodating the flow guide assembly and the electronic module; and the cover is provided with a first vent hole and a second vent hole, and the flow guide assembly is capable of guiding air such that same enters the cavity from the first vent hole, flows through the electronic module, and is discharged from the second vent hole.

In some embodiments, the case comprises a first case and a second case pivotally connected to each other; the first case comprises a bottom plate and a side plate, the second case comprises a top plate and a side plate, and the closed space is formed when the first case and the second case are closed; and the cover covers the first case, and the cover forms the cavity with the first case.

In some embodiments, the flow guide assembly comprises a fan and an airflow guide plate, in which: the airflow guide plate is provided between the fan and the cover, and the airflow guide plate extends from the top plate of the cover to the fan to block the airflow between the cover and the fan; the airflow guide plate is located between a first region and a second region of the cover, the first region being a region where the first vent hole is located, and the second region being a region where the second vent hole is located; a pre-set gap exists between the fan and the bottom of the waterproof case; the cavity comprises a first sub-cavity and a second sub-cavity divided by the airflow guide plate and the fan, wherein the first sub-cavity is in communication with the first vent hole, the second sub-cavity is in communication with the second vent hole, and the first sub-cavity and the second sub-cavity are communicated through the pre-set gap; the fan is capable of guiding the air such that same enters the first sub-cavity from the first vent hole, enters the second sub-cavity through the pre-set gap, and is discharged from the second vent hole; and the first electronic module is provided in the first sub-cavity or the second sub-cavity.

In some embodiments, the flow guide assembly further comprises a fan bracket for supporting the fan, the fan bracket being provided with an opening at a position corresponding to the electronic module.

In some embodiments, the cover is provided with the first vent holes at the top plate and the side plate of the first region, and/or the cover is provided with the second vent holes at the top plate and the side plate of the second region.

In some embodiments, the fan is a cross-flow fan.

In some embodiments, the electronic module is a first electronic module, and the electronic device further comprises a second electronic module, wherein the second electronic module is provided in the second case, and the first electronic module is electrically connected to the second electronic module.

In some embodiments, the first electronic module comprises a data processing module, the second electronic module comprises a display module, and the data processing module is electrically connected to the display module.

In some embodiments, the first electronic module further comprises an interface module, which is electrically connected to the data processing module and has at least one data interface; and a region of the cover corresponding to the data interface is provided to be hollowed.

It can be seen from the above solutions that in the electronic device provided by embodiments of the present invention, the flow guide assembly, the electronic module, etc. are all accommodated in the waterproof case, and the waterproof case forms a closed space and has the waterproof capability, and therefore can protect the components therein. Moreover, when the electronic device needs to work, the waterproof case is opened, the flow guide assembly guides the air such that same enters the cavity from the first vent hole and flows through the electronic module, thereby taking away the heat generated by the electronic module, and finally the air is discharged from the second vent hole, thereby taking the heat out of the cavity to facilitate heat dissipation of the electronic device. It can be seen that the embodiments of the present invention are not only waterproof but also facilitate heat dissipation, do not affect the operation of the electronic device, and prolong the service life of the electronic device.

The following embodiments are used to further describe the present invention in detail, such that the object, technical solutions and advantages of the present invention become clearer.

Embodiments of the present invention provide an electronic device, which may be a data processing device (for example, a big data processing device) or another electronic device. The electronic device comprises a waterproof case, and a flow guide assembly, an electronic module and a cover provided inside the waterproof case, in which: the waterproof case is a closed space formed by a top plate, a bottom plate, and a side plate; the cover comprises a top plate and a side plate provided on the top plate; the top and side plates of the cover and the bottom and side plates of the waterproof case form a cavity for accommodating the flow guide assembly and the electronic module; and the cover is provided with a first vent hole and a second vent hole, and the flow guide assembly is capable of guiding air such that same enters the cavity from the first vent hole, flows through the electronic module, and is discharged from the second vent hole.

It can be understood that since the air is introduced from the first vent hole and discharged from the second vent hole, the first vent hole is an air inlet hole, and the second vent hole is an air outlet hole.

It can be understood that the above electronic module is a module required by the electronic device to implement the main function thereof. For example, the electronic device is a data processing device, and the electronic module is a data processing module which can implement a data processing function. When the electronic device is working, the electronic module is the main component that generates heat.

In the electronic device provided by an embodiment of the present invention, the flow guide assembly, the electronic module, etc. are all accommodated in the waterproof case, and the waterproof case forms a closed space and has the waterproof capability, and therefore can protect the components therein. Moreover, when the electronic device needs to work, the waterproof case is opened, the flow guide assembly guides the air such that same enters the cavity from the first vent hole and flows through the electronic module, thereby taking away the heat generated by the electronic module, and finally the air is discharged from the second vent hole, thereby taking the heat out of the cavity to facilitate heat dissipation of the electronic device. It can be seen that the present invention is not only waterproof but also facilitates heat dissipation, does not affect the operation of the electronic device, and prolongs the service life of the electronic device.

Some specific embodiments of the electronic device provided by the present invention will be described below with reference to FIGS. 1-9.

The electronic device in this embodiment is used to execute a big data processing service, and the electronic device may also be referred to as a big data processing device. The electronic device specifically comprises: a waterproof case, and a first electronic module, a second electronic module, a cover, and a flow guide assembly provided inside the waterproof case, in which:

the waterproof case comprises a first case 11 and a second case 12 pivotally connected to each other, and a closed space is formed when the first case 11 and the second case 12 are closed; and the first case 11 comprises a bottom plate 6 and a side plate 8, and the second case 12 comprises a top plate 7 and a side plate 9, so that the closed space is formed by the bottom and side plates of the first case and the top and side plates of the second case. The first electronic module and the flow guide assembly are provided in the first case 11, the cover 16 covers the first case, the cover 16 comprises a top plate 163 and a side plate 164, and the top plate 163 and the side plate 164 of the cover 16 form a cavity with the bottom and side plates of the first case 11 to accommodate the first electronic module and the flow guide assembly; the second electronic module is provided in the second case 12;

the first electronic module comprises a data processing module 13 and an interface module 15, the interface module 15 is electrically connected to the data processing module 13, and the interface module 15 has at least one data interface 151; a region of the cover 16 corresponding to the data interface 151 is provided to be hollowed, that is, a hollowed region 165 is provided on the cover, and the position of the hollowed region 165 corresponds to that of the data interface 151;

the second electronic module comprises a display module 14, and the display module 14 is electrically connected to the data processing module 13;

the cover 16 is provided with first vent holes 161 at the top plate 163 and the side plate 164 of a first region, and the cover 16 is provided with second vent holes 162 at the top plate 163 and the side plate 164 of a second region; and the flow guide assembly comprises a fan 18, a fan bracket 21, and an airflow guide plate 17, wherein the airflow guide plate 17 is provided between the fan 18 and the cover 16, and the airflow guide plate extends from the top plate of the cover to the fan to block the airflow between the cover 16 and the fan 18; and the airflow guide plate 17 is located between the first and second regions of the cover 16. A gap exists between the fan 18 and the bottom of the waterproof case, and the cavity comprises a first sub-cavity 19 and a second sub-cavity 20 which are divided by the airflow guide plate and the fan, wherein the first sub-cavity 19 is in communication with the first vent holes 161, the second sub-cavity 20 is in communication with the second vent holes 162, and the first sub-cavity 19 and the second sub-cavity 20 are communicated. through the pre-set gap; the fan 18 is capable of guiding the air such that same enters the first sub-cavity 19 from the first vent holes 161, enters the second sub-cavity 20 through the pre-set gap, and is discharged from the second vent holes 162; and the first electronic module is provided in the first sub-cavity 161. The fan bracket 21 is provided for supporting the fan 18, and the fan bracket 21 is provided with an opening 211 at a position corresponding to the first electronic module.

In this embodiment, the data processing module 13 is used to implement the big data processing service. In practical applications, the data processing module 13 may be implemented with a variety of structures, one of which is: the data processing module 13 comprises a master processing unit, a switch and a plurality of slave processing units, the master processing unit and the slave processing units exchange information via the switch, that is, the master processing unit can send a control instruction to the slave processing units via the switch such that the slave processing units perform the big data processing service, and the slave processing units also feed back a processing result to the master processing unit via the switch. Since the big data has the characteristics of a large data volume and diversity, the data processing module 13 comprises the master processing unit responsible for controlling the process of data processing and exchanging data with the outside, and the slave processing units responsible for processing the data to ensure rapid completion of data processing. Of course, the data processing module 13 with other structures may also be used. For example, in FIGS. 5 and 9, the data processing module 13 comprises ten processing units 131, wherein one processing unit is a master processing unit and the other nine processing units are slave processing units.

It can be understood that, in some alternative embodiments, if the electronic device is not used for the big data processing service but for other purposes, other electronic modules can be used to implement the corresponding functions thereof, and the corresponding technical solutions can also achieve the basic aim that the electronic device facilitates heat dissipation while being waterproof, and therefore should also fall within the scope of protection of the present invention.

In this embodiment, in addition to the data processing module 13 in the waterproof case, a display module 14 is further comprised. The display module 14 is electrically connected to the data processing module 13, so that the display module 14 can display the relevant process or data of the data processing module 13 during the execution of data processing, to give the user a more intuitive understanding of the data processing process or result.

In practical applications, the display module 14 is of various structural forms. By way of example, the display module 14 comprises a display screen, a fixing structure for fixing the display screen inside the first case 11, etc. The display screen may use any kind of display screens such as a liquid crystal display screen, an electroluminescent display screen, an LED display screen, and a cathode-ray tube display screen.

It can be understood that, in some alternative embodiments, the display module 14 may not be provided, the relevant data in the data processing process may be displayed by means of an external display device when needed, so that the display module 14 does not have to be provided, and the corresponding technical solutions can also achieve the basic aim that the electronic device facilitates heat dissipation while being waterproof, and therefore should also fall within the scope of protection of the present invention.

In this embodiment, an interface module 15 is further provided in the second case 12, the interface module 15 is connected to the data processing module 13, and the interface module 15 has at least one data interface 151, such that the data processing module 13 can be connected to an external device via the data interface 151 of the interface module 15. As an example, when some data are collected by an external device and need to be processed by the big data processing device, the data stored in the external device can be transmitted to the data processing module 13 via the data interface 151 of the interface module 15 to perform relevant processing. As another example, if the display module 14 is not provided in the big data processing device, or in some scenarios, the data processing process needs to be displayed in front of a large number of people but the display screen provided by the data processing device is small, and an external display device is required, the external display device may then be connected to the data interface 151 of the interface module 15.

It can be understood that, in some alternative embodiments, no matter whether the interface module 15 is provided, the technical solutions thereof can achieve the basic aim that the electronic device facilitates heat dissipation while being waterproof, and therefore should also fall within the scope of protection of the present invention.

In this embodiment, since both the cover 16 and the interface module 15 are provided, the cover 16 is provided with the hollowed region 165 corresponding to the data interface 151 of the interface module 15, so as to expose the data interface 151 of the interface module 15. One hollowed region 165 of the cover in FIG. 6 corresponds to one data interface 151 in FIG. 5. Of course, other methods may be used. For example, the location of the cover 16 corresponding to the entire interface module 15 is provided to be hollowed. Of course, if in a certain embodiment, the interface module 15 is not provided in the second case 12, there is no need to provide the hollowed region on the cover 16.

In this embodiment, the first electronic module comprising the data processing module 13 and the interface module 15 is provided in the first case 11, the second electronic module comprising the display module 14 is provided in the second case 12, and the different electronic modules can implement the different functions, wherein the data processing module 13 is a hardware module in which the electronic device implements the main function thereof. It can be understood that, in some alternative embodiments, the second electronic module mentioned above is not necessarily provided, the interface module 15 in the first electronic module is also not necessarily provided, and if the electronic device is not used for the big data processing service, the data processing module 13 can also be replaced with another electronic module having the corresponding function.

In this embodiment, the waterproof case comprises the first case 11 and the second case 12 pivotally connected to each other, and after the waterproof case is opened, the data processing process can be viewed via the display module 14 in the first case 11. When the waterproof case is closed, that is, when the first case 11 and the second case 12 are closed, the waterproof case can provide a certain waterproof function to the display module 14, data processing module 13, and other circuit structures therein. Of course, in addition to the waterproof function, the waterproof case can also provide a dustproof and even shockproof function.

It can be understood that, in some alternative embodiments, the waterproof case can also use other structural forms. For example, when the electronic device is not provided with the display module 14, the space for accommodating the display module 14 is not provided in the waterproof case. Regardless of the structure of the waterproof case, the technical solutions thereof can also achieve the basic aim that the electronic device facilitates heat dissipation while being waterproof, and therefore should also fall within the scope of protection of the present invention.

In this embodiment, the flow guide assembly comprises a fan 18, an airflow guide plate 17, etc., wherein the airflow guide plate 17 is located between the first region and the second region of the cover 16, and the airflow guide plate 17 is provided between the cover 16 and the fan 18 at the same time, to block the air circulation between the cover 16 and the fan 18. Moreover, there is a gap between the fan 18 and the bottom of the waterproof case.

Figure 1:
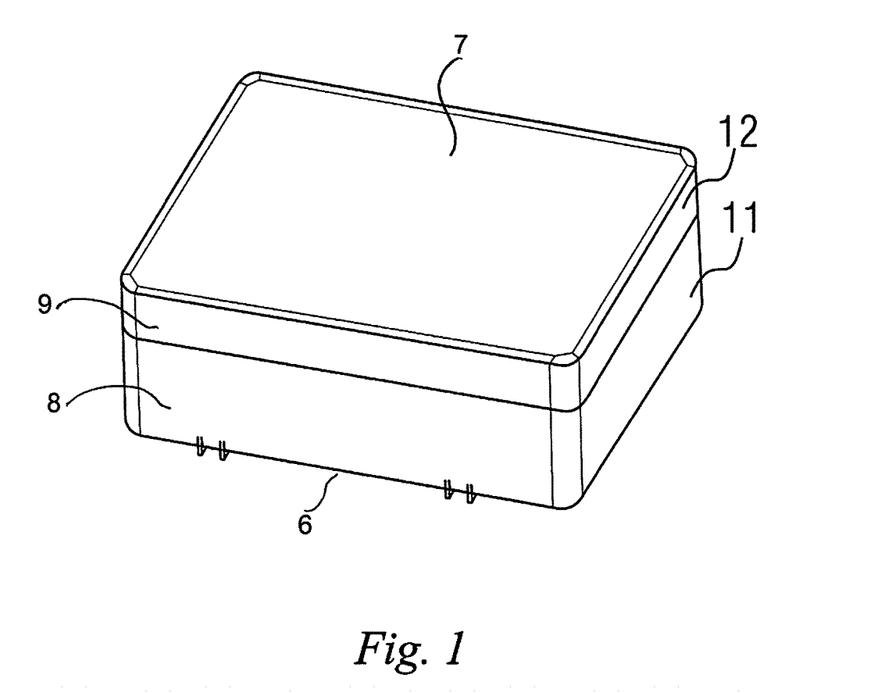
FIG. 1 is a structural schematic view of an electronic device of an embodiment of the present invention in a closed state.
Figure 2:
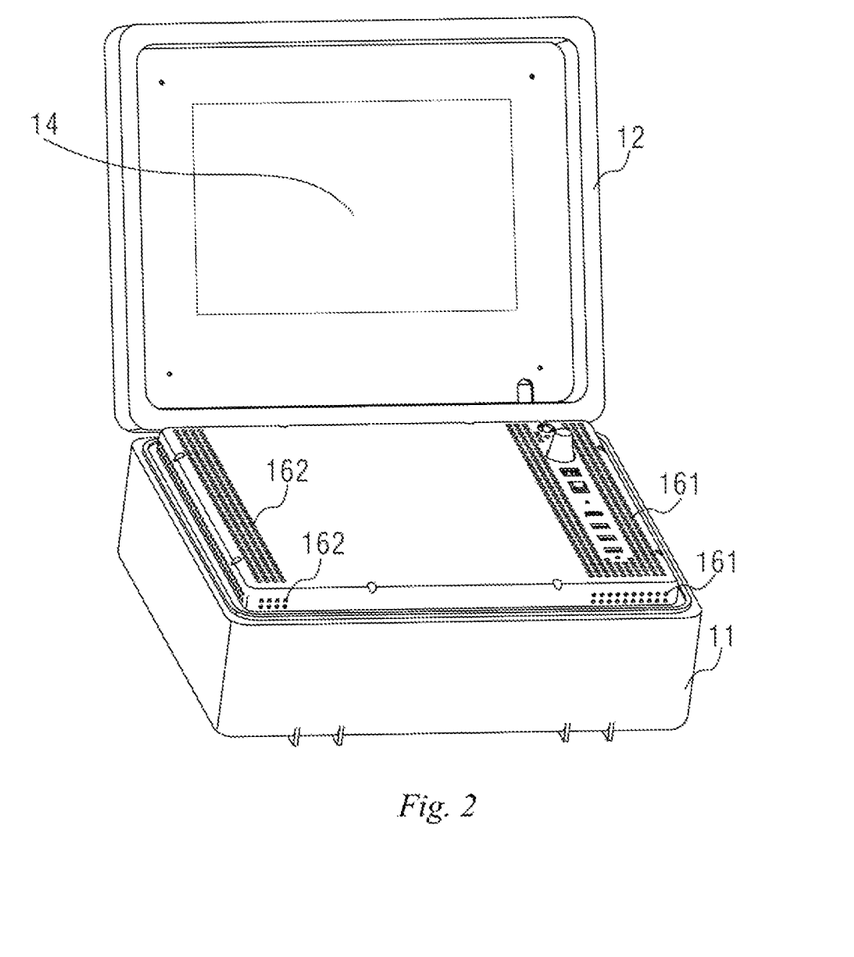
FIG. 2 is a structural schematic view of the electronic device shown in FIG. 1 in an open state.
Figure 3:
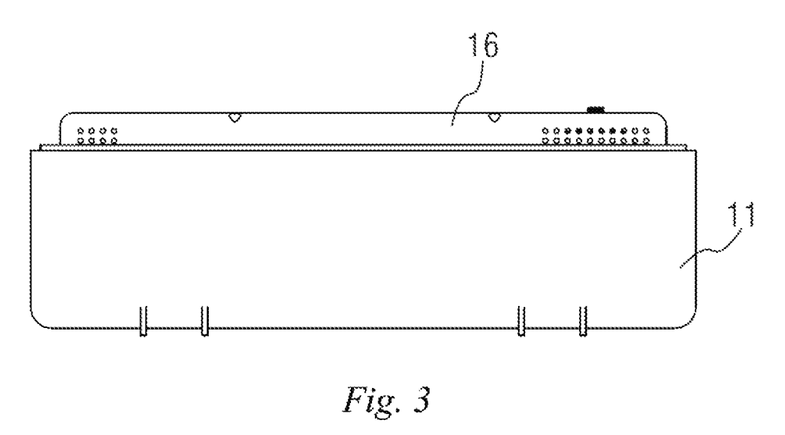
FIG. 3 is a front view of a first case and a cover covering same in FIG. 2.
Figure 4:
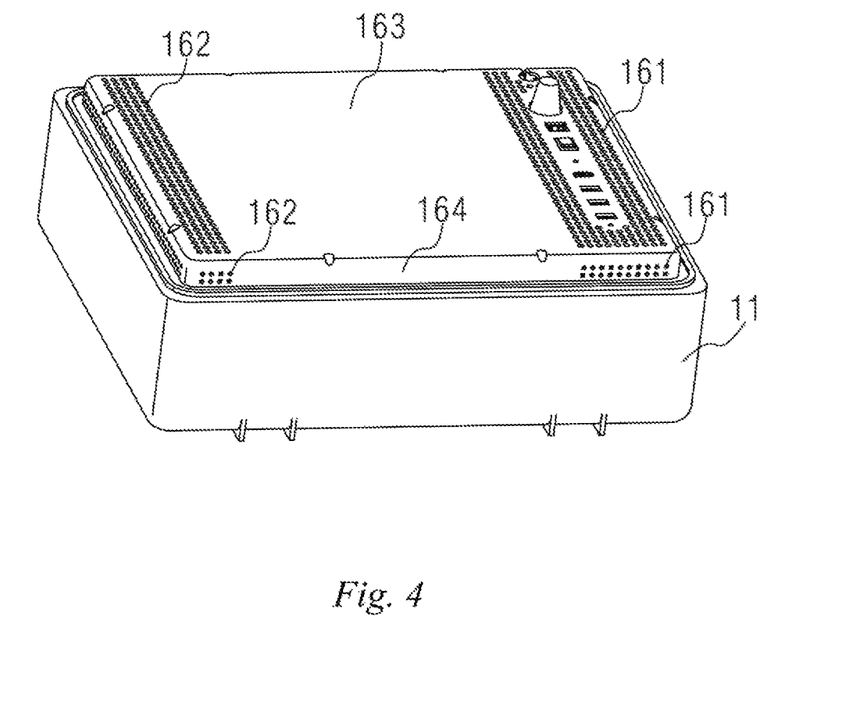
FIG. 4 is a structural schematic perspective view of FIG. 3.
Figure 5:
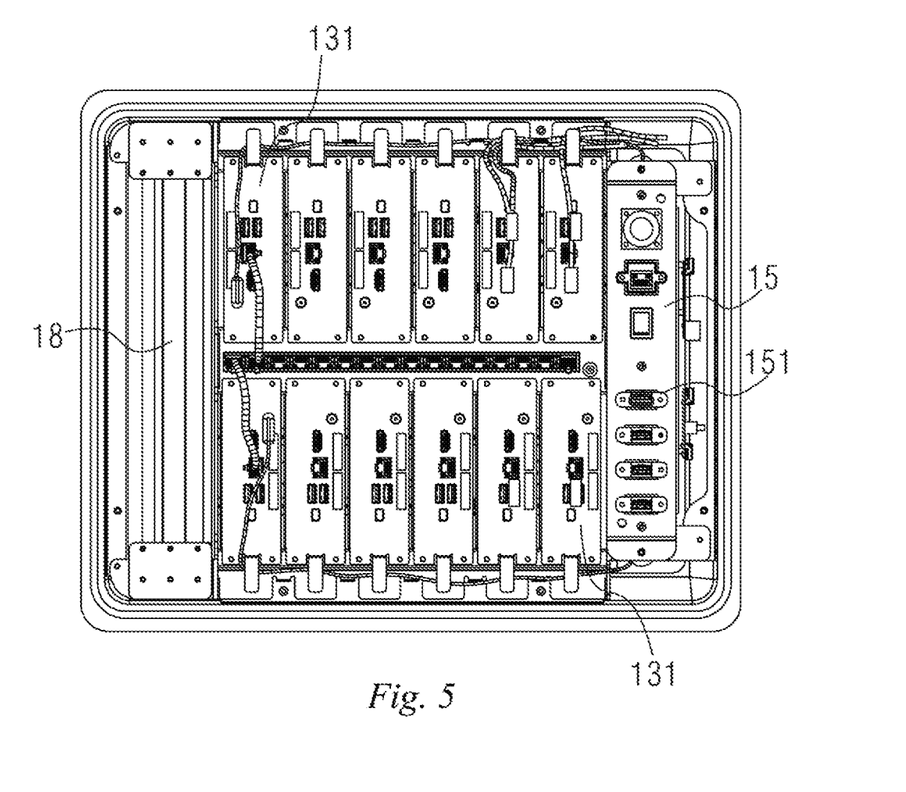
FIG. 5 is a top view of the first case in FIG. 3 and its internal structure with the cover being removed.
Figure 6:
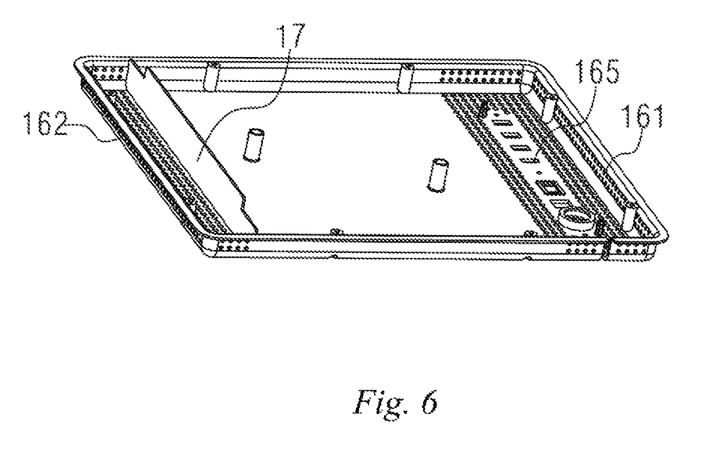
FIG. 6 is a structural schematic view of the cover of FIG. 3.
Figure 7:
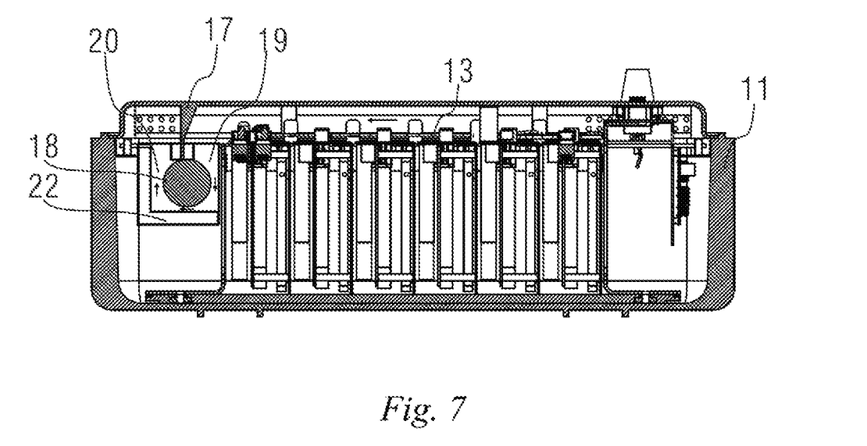
FIG. 7 is a cross-sectional view of FIG. 3.
Figure 8:
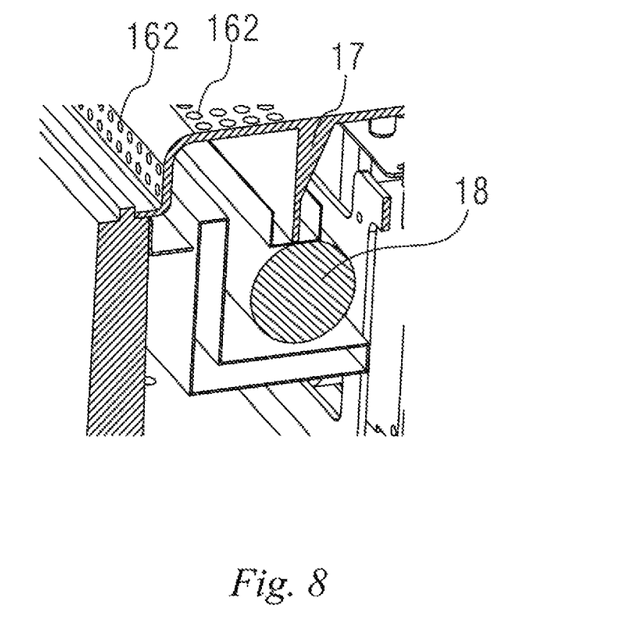
FIG. 8 is a schematic perspective enlarged view of a partial structure of FIG. 7.

That is to say, referring to FIGS. 7 and 8, the airflow guide plate 17 and the fan 18 divide the cavity into two sub-cavities: a first sub-cavity 19 and a second sub-cavity 20, wherein the first sub-cavity 19 is in communication with the first vent holes 161, the second sub-cavity 20 is in communication with the second vent holes 162, and the two sub-cavities are in communication between the fan 18 and the bottom of the waterproof case. In this embodiment, a fan bracket 21 for supporting the fan 18 is further provided, and a gap also exists between the fan bracket 21 and the bottom of the fan 18, so that the airflow in the first sub-cavity 19 can enter the second sub-cavity 20 from the gap between the fan bracket 21 and the bottom of the fan 18. Since the airflow guide plate 17 and the fan 18 divide the cavity into two sub-cavities, the fan 18 forms different pressure zones more easily during operation, thereby forming a circulating airflow.

In FIG. 7, the fan 18 forms the different pressure zones in such a manner that an impeller in the fan 18 rotates clockwise, so that the air in the first sub-cavity 19 can be brought into the second sub-cavity 20, and a negative pressure is formed in the first sub-cavity 19 and a positive pressure in the second sub-cavity 20, thereby causing the air outside the cavity to be introduced from the first vent holes 161, and the air inside the second sub-cavity 20 to be discharged from the second vent holes 162, so as to form a flowing airflow which takes away the heat generated by the first electronic module.

In the above process, the airflow guide plate 17 blocks the air circulation between the cover 16 and the fan 18, so that the air can only be circulated through the gap between the fan 18 and the bottom of the case, which is equivalent to the flow guiding function; and the fan 18 provides power for the flow of air such that the air flows following a path formed by components such as the airflow guide plate 17, the fan 18, and an inner wall of the first case 11. It can be seen that the airflow guide plate 17 and the fan 18 cooperate to guide the flow of air.

The flow guide assembly of the above structure, in addition to being relatively easy to form different pressure zones to form the flowing airflow, also allows the airflow to enter the cavity from the first vent holes 161, and also to flow toward the bottom of the fan 18 so as to be able to flow through the gap between the fan 18 and the bottom of the case, so that the travel of the airflow will be relatively long and more heat can be taken away.

As can be seen in FIG. 7, the first vent holes 161 are provided on one side of the cover 16, and the second vent holes 162 are provided on the other side of the cover 16, such that when air enters the interior of the cavity from the first vent holes 161, it can flow from one side of the cavity to the other side of the cavity, so that the travel of the airflow is relatively long, and more heat can be taken away. In this embodiment, the first electronic module is provided in the first sub-cavity 19 (see FIG. 7). Of course, in some alternative embodiments, the first electronic module may also be provided in the second sub-cavity 20.

In practical applications, there are a variety of types of fans 18, which may be selected according to requirements. For example, a cross-flow fan 18 can be selected, which has a simple structure, a small volume, and a uniform distribution of air in a width-wise direction of the fan 18. In addition, since the above airflow guide plate 17 is provided between the cover 16 and the fan 18, the airflow guide plate 17 and the cover 16 may be integrally provided, that is, the airflow guide plate 17 and the cover 16 are of an integral structure, which facilitates manufacturing, and since there is no gap between the cover 16 and the airflow guide plate 17, the circulation of the airflow between the cover 16 and the airflow guide plate 17 can be further prevented.

It can be understood that the flow guide assembly provided in this embodiment can relatively easily form different pressure zones and take away more heat. Of course, in some alternative embodiments, flow guide assemblies with other structures may also be used, for example, a flow guide assembly without a fan bracket provided therein. Regardless of the structure of the flow guide assembly, as long as it can guide the air such that same is introduced from the first vent holes 161, flows through the first electronic module, and is discharged from the second vent holes 162, the technical solutions thereof can also achieve the basic aim that the electronic device facilitates heat dissipation while being waterproof, and therefore should also fall within the scope of protection of the present invention.

Figure 9:
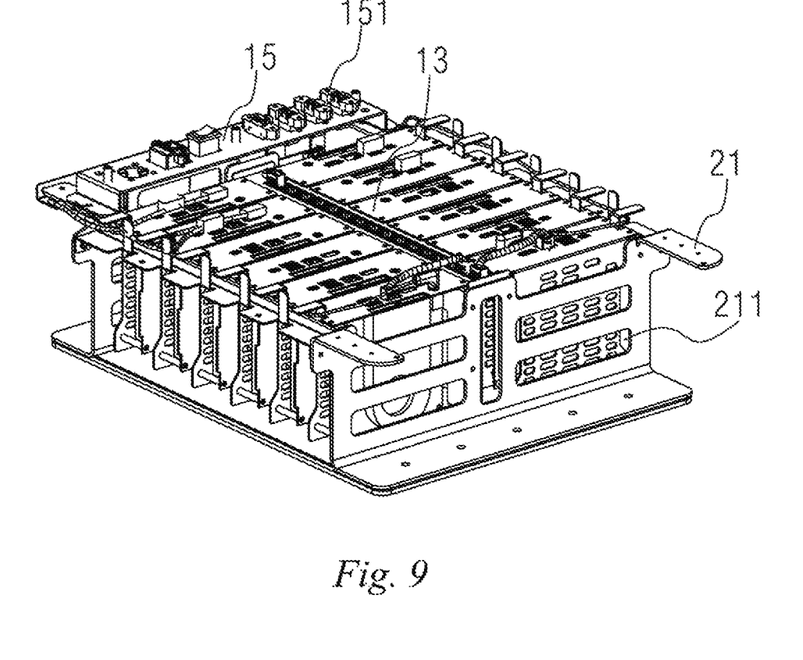
FIG. 9 is a structural schematic view of the remaining components in FIG. 5 with a fan and the first case being removed.

In this embodiment, referring to FIG. 9, the fan bracket 21 is used to support the fan, so that the electronic device can keep the fan 18 stable during moving. At the same time, the fan bracket 21 is provided with an opening 211 at a position corresponding to the first electronic module, so that the fan bracket 21 does not prevent the airflow from taking away the heat generated by the first electronic module while fixing the fan 18.

It can be understood that, in some alternative embodiments, the fan bracket 21 is not necessarily provided, for example, a flow guide assembly with another structure is used in which the fan bracket 21 is not required, and the technical solutions thereof can also achieve the basic aim that the electronic device facilitates heat dissipation while being waterproof, and therefore should also fall within the scope of protection of the present invention.

In this embodiment, since the cover 16 provided in the waterproof case comprises the top plate 163 and the side plate 164, the cover 16 is not of a planar structure but a three-dimensional structure. Moreover, the cover 16 covers or is provided over the first case 11, that is, the top plate 163 and the side plate 164 of the cover 16 are higher than an upper edge of the second case 12, and the vent hole is provided not only on the top plate 163 but also on the side plate 164. This allows the airflow to enter the cavity more smoothly, and be more smoothly discharged from the cavity, which is beneficial to the flow of the air.

It can be understood that, in some alternative embodiments, it is possible for the cover 16 to only provide the first vent holes 161 on the top plate 163 and the side plate 164 of the first region, and to provide the second vent holes 162 on the top plate 163 or the side plate 164 of the second region; it is also possible to provide the second vent holes 162 on the top plate 163 and the side plate 164 of the second region, and to provide the first vent holes 161 on the top plate 163 or the side plate 164 of the first region; and the cover 16 with another structure may also be used, for example, the cover 16 is a planar structure covering the first case 11, that is, the cover 16 has only the top plate 163 and no side plate 164, so that only the top plate 163 can be provided with the vent hole, and the technical solutions thereof can also achieve the basic aim that the electronic device facilitates heat dissipation while being waterproof, and therefore should also fall within the scope of protection of the present invention.

In practical applications, the waterproof case may be made of a variety of waterproof materials. For example, polypropylene (referred to as PP) can be selected. Since the polypropylene is a semi-crystalline thermoplastic, is lightweight, has a relatively high impact resistance and also relatively strong mechanical properties, and is also resistant to a variety of organic solvents and acid-alkali corrosion, the case can be lighter and easy to carry while being waterproof.

The above description is only the preferred embodiments of the present invention, which are not intended to limit the present invention, any modifications, equivalent substitutions, or improvements made within the spirit and principles of the present invention shall be included within the scope of protection of the present invention.

The patent claims of the application are formulation proposals without prejudice for obtaining more extensive patent protection. The applicant reserves the right to claim even further combinations of features previously disclosed only in the description and/or drawings.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

None of the elements recited in the claims are intended to be a means-plus-function element within the meaning of 35 U.S.C. § 112(f) unless an element is expressly recited using the phrase "means for" or, in the case of a method claim, using the phrases "operation for" or "step for."

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. An electronic device, comprising:
a waterproof case including a closed space, the closed space being formed by a case top plate, a case bottom plate and a case side plate connected between the case top plate and the case bottom plate; and
a flow guide assembly, an electronic module and a cover, each of the flow guide assembly, the electronic module and the cover provided in the closed space of the waterproof case, the cover including a cover top plate and a cover side plate,
the cover top plate and the cover side plate, together with the case bottom plate and the case side plate, forming an accommodation space to accommodate the flow guide assembly and the electronic module,
the cover including a first vent hole and a second vent hole, and
the flow guide assembly being configured to guide air, entering the accommodation space from the first vent hole, to flow through the electronic module, and to be discharged from the second vent hole, the flow guide assembly including
a fan and
an airflow guide plate, the airflow guide plate being provided on the cover top plate of the cover and extending from the cover top plate of the cover toward the case bottom plate, to divide the fan into a first sub-cavity and a second sub-cavity, the first sub-cavity and a second sub-cavity being in communication with each other, the first sub-cavity further being in communication with the first vent hole, and the second sub-cavity further being in communication with the second vent hole;
wherein the fan is configured to guide the air to enter the first sub-cavity from the first vent hole, wherein the fan is configured to guide the air to enter the second sub-cavity under the guidance of the airflow guide plate, and wherein the fan is configured to guide the air to be discharged from the second vent hole; and
wherein the electronic module is provided in the first sub-cavity.

2. The electronic device of claim 1, wherein the waterproof case includes a first case and a second case, the first case and the second case being pivotally connected,
the first case including the case bottom plate and a first case side plate, extending from the case bottom plate,
the second case including the case top plate and a second case side plate, extending from the case top plate, and
the first case and the second case being configured to relatively pivot, such that the first case side plate and the second case side plate are configured to come into contact to form the closed space; and
the cover being provided in a space, defined by the case bottom plate and the first case side plate, of the first case and being located relatively above the case bottom plate, and
the cover top plate and the cover side plate of the cover, together with the case bottom plate and the first case side plate of the first case, forming the accommodation space.

3. The electronic device of claim 2, wherein the electronic module comprises a data processing device.

4. The electronic device of claim 3, further comprising an input/output interface device, the input/output interface device being connected to the data processing device.

5. The electronic device of claim 2, wherein
the first vent hole includes a plurality of vent holes, each of the plurality of vent holes being formed in the cover top plate and the cover side plate of the cover, and
the second vent hole includes a plurality of vent holes, each of the plurality of vent holes being formed in the cover top plate and the cover side plate of the cover.

6. The electronic device of claim 5, wherein the fan is a cross-flow fan.

7. The electronic device of claim 1, wherein
the first vent hole includes a plurality of vent holes, each of the plurality of vent holes being formed in the cover top plate and the cover side plate of the cover, and
the second vent hole includes a plurality of vent holes, each of the plurality of vent holes being formed in the cover top plate and the cover side plate of the cover.

8. The electronic device of claim 7, wherein the fan is a cross-flow fan.

9. The electronic device of claim 7, wherein the electronic module comprises a data processing device.

10. The electronic device of claim 9, further comprising an input/output interface device, the input/output interface device being connected to the data processing device.

11. The electronic device of claim 1, wherein the fan is a cross-flow fan.

12. The electronic device of claim 11, wherein the electronic module comprises a data processing device.

13. The electronic device of claim 12, further comprising an input/output interface device, the input/output interface device being connected to the data processing device.

14. The electronic device of claim 1, wherein the electronic module comprises a data processing device.

15. The electronic device of claim 14, further comprising an input/output interface device, the input/output interface device being connected to the data processing device.

* * * * *